US012677374B2

(12) United States Patent
Kim et al.

(10) Patent No.: US 12,677,374 B2
(45) Date of Patent: Jul. 7, 2026

(54) PROTECTION CIRCUIT UNIT AND METHOD OF BONDING LEAD PORTIONS AND PROTECTION CIRCUIT UNIT

(71) Applicant: LG ENERGY SOLUTION, LTD., Seoul (KR)

(72) Inventors: Sang Jin Kim, Daejeon (KR); Young Joong Kim, Daejeon (KR); Jin Hyun Lee, Daejeon (KR); Dae Ho Jung, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 316 days.

(21) Appl. No.: 18/271,193

(22) PCT Filed: Jan. 18, 2022

(86) PCT No.: PCT/KR2022/000935
§ 371 (c)(1),
(2) Date: Jul. 6, 2023

(87) PCT Pub. No.: WO2022/164109
PCT Pub. Date: Aug. 4, 2022

(65) Prior Publication Data
US 2024/0074061 A1 Feb. 29, 2024

(30) Foreign Application Priority Data

Jan. 27, 2021 (KR) ........................ 10-2021-0011857

(51) Int. Cl.
H05K 1/181 (2026.01)
H05K 1/03 (2006.01)

(52) U.S. Cl.
CPC ........... H05K 1/181 (2013.01); H05K 1/0306 (2013.01); *H05K 2201/0212* (2013.01); *H05K 2201/10037* (2013.01); *H05K 2201/2054* (2013.01)

(58) Field of Classification Search
CPC ................. H05K 1/181; H05K 1/0306; H05K 2201/0212; H05K 2201/10037;
(Continued)

(56) References Cited

U.S. PATENT DOCUMENTS 5,034,569 A 7/1991 Gofuku et al.
9,240,618 B2 * 1/2016 Yang ................... H01M 10/425
(Continued)

FOREIGN PATENT DOCUMENTS

CN 104900710 A 9/2015
CN 110544809 A 12/2019
(Continued)

OTHER PUBLICATIONS

European Search Report for European Application No. 22746137.3, dated May 15, 2024.
(Continued)

*Primary Examiner* — Timothy J Thompson
(74) *Attorney, Agent, or Firm* — Birch, Stewart, Kolasch & Birch, LLP

(57) ABSTRACT

Discussed is a protection circuit module that may include a printed circuit board configured to be connected to a positive lead part and a negative lead part connected to a battery cell, wherein the printed circuit board includes an upper layer bonded to the positive lead part and the negative lead part so as to be electrically connected; an intermediate layer including a first insulating layer including a material containing an epoxy resin and provided below the upper layer; and a laser
(Continued)

reflective layer provided between the upper layer and the first insulating layer and reflecting light from a laser.

9 Claims, 3 Drawing Sheets

(58) Field of Classification Search
CPC ......... H05K 2201/2054; H05K 1/0366; H05K 2203/107; H05K 3/328; H05K 1/09; H05K 1/111; H01M 10/42; H01M 10/425; H01M 2200/00; H01M 2220/30; H01M 50/202; H01M 50/284; H01M 50/574; Y02E 60/10
See application file for complete search history.

(56) References Cited

U.S. PATENT DOCUMENTS

| | | | |
|---|---|---|---|
| 9,537,136 B2 * | 1/2017 | Ryu ..................... | H01M 50/178 |
| 2004/0108937 A1 * | 6/2004 | Ernsberger ............. | H05K 1/167 |
| | | | 338/320 |
| 2016/0358952 A1 | 12/2016 | Bu | |
| 2020/0144677 A1 * | 5/2020 | Choi ................... | H01M 50/574 |
| 2020/0381696 A1 * | 12/2020 | Park ....................... | B23K 26/21 |

FOREIGN PATENT DOCUMENTS

| | | | |
|---|---|---|---|
| JP | 8-186061 A | 7/1996 | |
| JP | 9-326548 A | 12/1997 | |
| JP | 2002-271039 A | 9/2002 | |
| JP | 2004-171896 A | 6/2004 | |
| KR | 10-2010-0113793 A | 10/2010 | |
| KR | 10-2010-0123155 A | 11/2010 | |
| KR | 10-2012-0073932 A | 7/2012 | |
| KR | 10-2014-0014982 A | 2/2014 | |
| KR | 10-2016-0094623 A | 8/2016 | |
| KR | 10-1917176 B1 | 11/2018 | |
| KR | 10-2020-0007480 A | 1/2020 | |
| KR | 10-2131984 B1 | 7/2020 | |
| WO | WO2010078611 A1 * | 7/2010 | |

OTHER PUBLICATIONS

International Search Report (PCT/ISA/210) issued in PCT/KR2022/000935, dated Apr. 19, 2022.

* cited by examiner

PROTECTION CIRCUIT UNIT AND METHOD OF BONDING LEAD PORTIONS AND PROTECTION CIRCUIT UNIT

TECHNICAL FIELD

The present invention relates to a protection circuit module and a method for bonding a lead part and a protection circuit module, and more particularly, to a protection circuit module that can prevent damage to the protection circuit module by laser when using a laser to connect the battery cell and the protection circuit module, and a method for bonding a lead part and a protection circuit module.

BACKGROUND ART

A protection circuit module (PCM) is connected to the battery cell to prevent overcharging and overdischarging, or preventing overcurrent from flowing. The PCM continuously detects voltage, current, temperature, etc. of the battery cell, and determines the state of the battery cell using the detected values. And, when overcharge, overdischarge, overcurrent, etc. are detected and it is determined that the battery cell is in an abnormal state, the PCM controls the operation of the battery cell. That is, the PCM stops charging or discharging of the battery cell, or blocks the electrical path.

In connecting the PCM and the battery cell, a bonding method using a laser is used. That is, after disposing the PCM on the lower side of the positive lead part and the negative lead part connected to the battery cell, the laser is irradiated from the upper side. Then, the positive and negative lead parts are welded and joined to the upper part of the PCM by heat by the laser.

Meanwhile, the PCM includes a copper foil connected to or bonded to positive and negative lead parts, a plurality of prepreg layers and a plurality of copper layers stacked on the lower side of the copper foil. In this case, the prepreg layer and the copper layer are alternately stacked.

However, the prepreg layer has a high transmittance with respect to the laser. Accordingly, when a laser is irradiated for bonding, the laser passes through the prepreg layer located below the copper foil, and then is incident on another layer laminated thereunder. Accordingly, when a laser is irradiated for bonding, the laser passes through the prepreg layer located below the copper foil, and then is incident on another layer laminated thereunder.

PRIOR ART LITERATURE (Patent Document 1) Korean Patent Application Laid-Open No. 10-2016-0094623

DISCLOSURE OF THE INVENTION

Technical Problem

The present invention provides a protection circuit module and a method of bonding a lead part and a protection circuit module capable of preventing the laser irradiated from the upper side from being transmitted to the lower side of the insulating layer.

Technical Solution

According to an embodiment of the present invention, a protection circuit module includes a printed circuit board configured to be connected to a positive lead part and a negative lead part connected to a battery cell, wherein the printed circuit board includes: an upper layer bonded to the positive lead part and the negative lead part so as to be electrically connected; an intermediate layer including a first insulating layer including a material containing an epoxy resin and provided below the upper layer; and a laser reflective layer provided between the upper layer and the first insulating layer and reflecting light from a laser.

The laser reflective layer may have a reflectance of 95% or more of the light having a wavelength of 1000 nm to 1100 nm.

The laser reflective layer may have a reflectance of 95% or more of the light having a wavelength of 1060 nm to 1080 nm.

The laser reflective layer may include silver (Ag).

The laser reflective layer may be thinner than the upper layer and the intermediate layer.

The upper layer may include copper (Cu), wherein the first insulating layer may include a material including the epoxy resin and glass fiber.

The intermediate layer includes: second and third insulating layers provided below the first insulating layer; a first metal layer provided between the first insulating layer and the second insulating layer; and a second metal layer provided between the second insulating layer and the third insulating layer.

The second and third insulating layers may include a material including an epoxy resin and glass fiber, wherein the first and second metal layers may be made of copper (Cu).

According to an embodiment of the present invention, a bonding method of a lead part and a protection circuit module includes: preparing a printed circuit board including a laser reflective layer to reflect light of a laser having a wavelength of 1000 nm to 1100 nm and having a reflectivity of 95% or more; preparing a protection circuit module by mounting a protection circuit element on the printed circuit board; locating the protection circuit module below the lead part connected to an electrode of a battery cell; and bonding the lead part and the printed circuit board by irradiating the light of the laser from an upper side of the lead part.

The preparing of the printed circuit board may include: preparing an upper layer using copper (Cu); preparing a first insulating layer using a material including an epoxy resin; and preparing the laser reflective layer between the upper layer and the first insulating layer.

The preparing of the printed circuit board includes: preparing second and third insulating layers under the first insulating layer; preparing a first metal layer between the first insulating layer and the second insulating layer; and preparing a second metal layer between the second insulating layer and the third insulating layer, wherein the first to third insulating layers may be prepared of a material including an epoxy resin and glass fiber, and wherein the first and second metal layers may include copper (Cu).

The preparing of the laser reflective layer may include preparing the laser reflective layer using silver (Ag).

Advantageous Effects

According to an embodiment of the present invention, it is possible to suppress or prevent the laser irradiated for bonding the lead part and the protection circuit module from being incident to the intermediate layer of the protection circuit module. Therefore, it is possible to prevent the intermediate layer of the protection circuit module from being damaged by the laser, thereby preventing damage to the protection circuit module by the laser.

BRIEF DESCRIPTION OF THE DRAWINGS

FIG. 1 is a diagram illustrating a battery pack including a protection circuit module according to an embodiment of the present invention.

MODE FOR CARRYING OUT THE INVENTION

Figure 2:
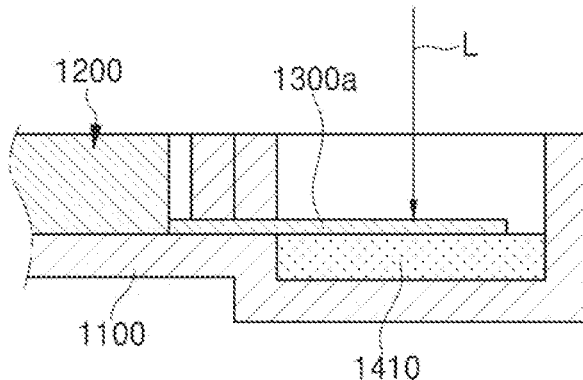
FIG. 2 is a diagram conceptually illustrating a state in which a laser is irradiated from the upper side of the lead part in order to connect the lead part and the printed circuit board of the protection circuit module.

Hereinafter, embodiments of the present invention will be described in more detail with reference to the accompanying drawings. However, the present invention is not limited to the embodiments disclosed below, but will be implemented in various different forms, and these embodiments are provided to complete the disclosure of the present invention, and to fully inform a person of ordinary skill in the scope of the invention. The drawings may be exaggerated in order to explain the embodiment of the present invention, and like reference numerals in the drawings refer to the same components.

Figure 1:
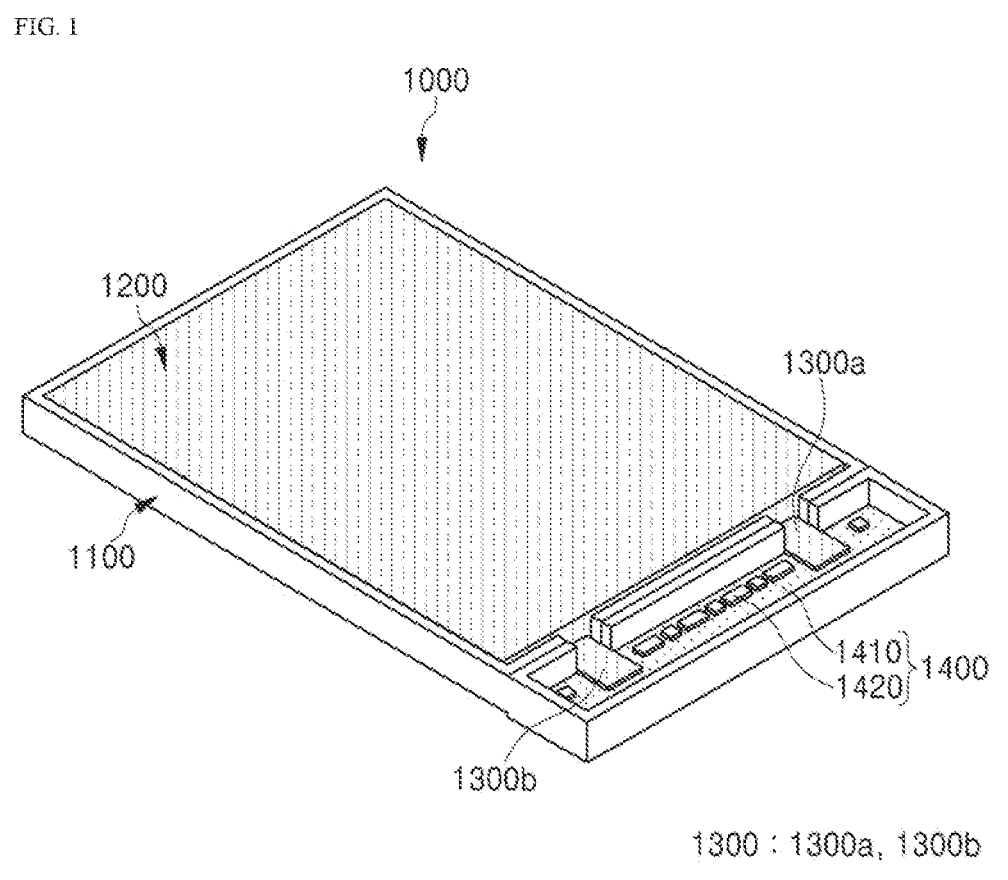
Figure 3:
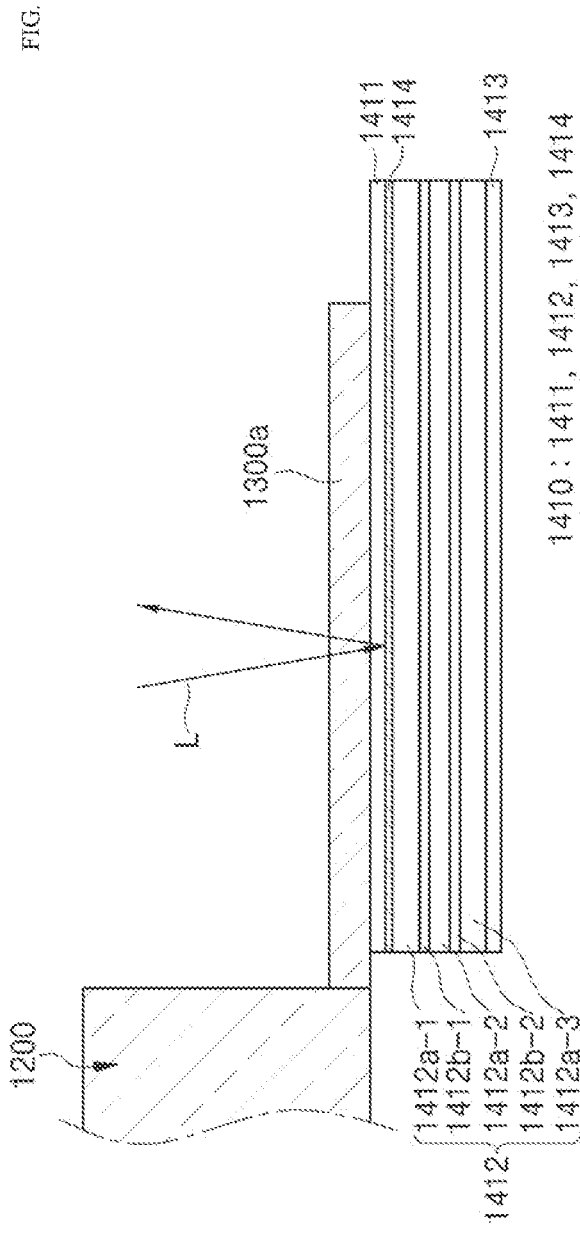
FIG. 3 is a diagram illustrating a configuration of a printed circuit board according to an embodiment of the present invention and a state in which a laser is irradiated from an upper side of a lead part in order to connect the printed circuit board and the lead part.

FIG. 1 is a diagram illustrating a battery pack including a protection circuit module according to an embodiment of the present invention. FIG. 2 is a diagram conceptually illustrating a state in which a laser is irradiated from the upper side of the lead part in order to connect the lead part and the printed circuit board of the protection circuit module. FIG. 3 is a diagram illustrating a configuration of a printed circuit board according to an embodiment of the present invention and a state in which a laser is irradiated from an upper side of a lead part in order to connect the printed circuit board and the lead part.

Here, FIGS. 2 and 3 are diagrams illustrating a state in which a laser is irradiated from the upper side of the lead part in order to connect the positive lead part and the printed circuit board among the lead parts.

Referring to FIG. 1, a battery pack 1000 according to an embodiment of the present invention includes a case 1100 having an inner space, a battery cell 1200 accommodated inside the case 1100 and charging and discharging electricity, a lead part 1300 including a positive lead part 1300a and a negative lead part 1300b connected to the battery cell 1200, and a protection circuit module 1400 connected to the positive and negative lead parts 1300a and 1300b.

The case 1100 includes an internal space that can accommodate the battery cell 1200, positive and negative lead parts 1300a and 1300b, and a protection circuit module 1400. The shape of the case 1100 is not particularly limited, and any shape may be provided as long as it has an internal space that can accommodate the battery cell 1200, the positive and negative lead parts 1300a and 1300b, and the protection circuit module 1400.

The battery cell 1200 is a means for charging and discharging current, and may be a secondary battery. Such a battery cell may be a means including a positive electrode, a negative electrode, an electrolyte, and a separator positioned between the positive electrode and the negative electrode.

The lead part 1300 is a means for electrically connecting the battery cell 1200 and the protection circuit module 1400, and includes a positive lead part 1300a and a negative lead part 1300b. The positive lead part 1300a electrically connects the positive electrode of the battery cell 1200 and the protection circuit module 1400, and the negative lead part 1300b electrically connects the negative electrode of the battery cell 1200 and the protection circuit module. The positive and negative lead parts 1300a and 1300b may be made of, for example, nickel (Ni).

The protection circuit module 1400 is a means commonly referred to as a protection circuit module (PCM). The protection circuit module 1400 continuously detects the voltage, current, temperature, etc. of the battery cell 1200, and determines the state of the battery cell 1200 using the detected value. And, when overcharge, overdischarge, overcurrent, etc. are detected and it is determined that the battery cell 1200 is in an abnormal state, the protection circuit module 1400 controls the operation of the battery cell 1200. For example, the protection circuit module 1400 stops charging or discharging to the battery cell 1200, or blocks the electrical path. By the operation of the protection circuit module 1400, generation of heat and deterioration of the battery cell 1200 due to overcharging and overdischarging can be prevented, and a fire can be prevented.

As shown in FIG. 1, this protection circuit module 1400 includes a printed circuit board (PCB) 1410 connected to the positive and negative lead parts 1300a and 1300b and at least one protection circuit device 1420 mounted on the printed circuit board 1410.

The protection circuit element 1420 may be a passive or active element including a protection circuit, and may be mounted on or below the printed circuit board 1410. In addition, a plurality of protection circuit elements 1420 may be provided. The protection circuit element 1420 is provided to protect from the risk of ignition or explosion due to overcharge, overdischarge, heat due to overcurrent, and the like.

The printed circuit board 1410 is electrically connected to the positive and negative lead parts 1300a and 1300b, and is connected by a welding method using a laser. When described in more detail with reference to FIG. 2, after disposing the positive and negative lead parts 1300a and 1300b on the printed circuit board 1410, the laser L is irradiated from the upper side of the positive and negative lead parts 1300a and 1300b. In this case, as the laser L, a laser having a wavelength of 1000 nm to 1100 nm, more specifically 1060 nm to 1080 nm, and more specifically 1070 nm is used. The positive and negative lead parts 1300a and 1300b are welded, i.e., bonded, to the upper portion of the printed circuit board 1410 by the thermal energy of the laser L irradiated thereto.

Hereinafter, the printed circuit board 1410 of the protection circuit module 1400 according to the embodiment will be described with reference to FIG. 3. In this case, the positive lead part 1300a and the negative lead part 1300b connected to the printed circuit board 1410 are collectively referred to as a lead part 1300 for convenience of description.

As shown in FIG. 3, the printed circuit board 1410 according to the embodiment includes an upper layer 1411 and a lower layer 1413 each made of metal and spaced apart vertically, an intermediate layer 1412 provided between the upper layer 1411 and the lower layer 1413 and including an insulating layer that is light-transmitting, and a laser reflective layer 1414 positioned between the upper layer 1411 and the intermediate layer 1412 to reflect light.

The upper layer 1411 is electrically connected to, that is, bonded to, the lead parts 1300: 1300*a* and 1300*b*, and may be a layer constituting a circuit. The upper layer 1411 is made of a metal having conductivity so as to be electrically connected to the lead part 1300. For example, the upper layer 1411 may be made of copper (Cu), and thus the upper layer 1411 made of copper (Cu) may be referred to as a copper foil layer. And a protection circuit element 1420 may be mounted on the upper layer 1411, and accordingly, the protection circuit element 1420 may be electrically connected to the battery cell 1200 through a circuit, that is, the upper layer 1411 and the lead part 1300. In addition, the thickness of the upper layer 1411 may be provided to be 0.6 mm or more, and more specifically, may be provided to be 0.6 mm or more and 0.8 mm or less.

On the other hand, when the thickness of the upper layer 1411 is less than 0.6 mm, the conductivity of the upper layer 1411 is low, and electrical connection with the lead part 1300 may be unstable. In addition, the thickness of the upper layer 1411 is set to 0.8 mm or less because sufficient conductivity can be ensured with a thickness of 0.8 mm or less, and therefore, it is not necessary to make the thickness more than 0.8 mm.

The lower layer 1413 is a layer provided under the intermediate layer 1412, and may be provided in the same manner as the above-described upper layer 1411, and may be a layer constituting a circuit. That is, the lower layer 1413 may be a copper foil layer made of copper (Cu), and may be provided with a thickness of 0.6 mm or more, more specifically, a thickness of 0.6 mm or more and 0.8 mm or less.

The intermediate layer 1412 includes a plurality of insulating layers and at least one metal layer. And the insulating layer and the metal layer are alternately or alternately disposed. At this time, an insulating layer is disposed on the top and bottom, and a metal layer is disposed therebetween. And, the insulating layer is provided with a material containing an epoxy resin. Accordingly, the insulating layer has a property that light, that is, a laser L for bonding the lead part 1300 and the printed circuit board 1410 to each other, is transmitted. More specifically, the insulating layer may transmit a laser L of a wavelength for bonding the lead part 1300 and the printed circuit board 1410 to each other. That is, the insulating layer may transmit a laser of 1060 nm to 1080 nm, more specifically, a laser of 1070 nm more specifically than a 1000 nm to 1100 nm laser.

Hereinafter, the intermediate layer 1412 will be described in more detail. Referring to FIG. 3, the intermediate layer 1412 includes the uppermost first insulating layer 1412*a*-1, and a first metal layer 1412*b*-1, a second insulating layer 1412*a*-2, a second metal layer 1412*b*-2, and a third insulating layer 1412*a*-3 sequentially stacked from the first insulating layer 1412*a*-1 to the upper portion of the lower layer 1413. Accordingly, the first metal layer 1412*b*-1 is positioned between the first insulating layer 1412*a*-1 and the second insulating layer 1412*a*-2, and the second metal layer 1412*b*-2 is provided between the second insulating layer 1412*a*-2 and the third insulating layer 1412*a*-3.

The first and third insulating layers 1412*a*-1 and 1412*a*-3 may be prepregs in which an epoxy resin is impregnated into a fiber reinforcement. In this case, the fiber reinforcement may be, for example, fiber glass. In addition, the second insulating layer 1412*a*-2 may be a material in which epoxy resin-impregnated glass fibers are stacked in multiple layers, that is, FR-4.

The first and second metal layers 1412*b*-1 and 1412*b*-2 may be made of copper (Cu). In addition, the first and second metal layers 1412*b*-1 and 1412*b*-2 may have a thickness of 0.3 mm to 0.4 mm.

Meanwhile, the first to third insulating layers 1412*a*-1, 1412*a*-2, and 1412*a*-3 are materials including an epoxy resin and glass fibers as described above, and these materials have high transmittance of the laser L. That is, the transmittance with respect to the wavelength range of 1000 nm to 1100 nm of the laser L irradiated for bonding the lead part 1300 and the printed circuit board 1410 is high.

Accordingly, when irradiating a 1000 nm to 1100 nm laser from the upper side of the lead part 1300 for bonding, the laser L that has passed through the upper layer 1411 may pass through the first insulating layer 1412*a*-1, and then may pass through the lower side thereof. In this case, the first insulating layer 1412*a*-1 and the plurality of layers stacked thereunder, that is, the first metal layer 1412*b*-1, the second insulating layer 1412*a*-2, the second metal layer 1412*b*-2, and the third insulating layer 1412*a*-3 may be damaged, and accordingly, the printed circuit board 1410 may be damaged.

Accordingly, it is necessary to prevent the laser L irradiated to the printed circuit board 1410 from being incident on the intermediate layer 1412. That is, it is necessary to prevent the laser L from being incident on the lower side of the first insulating layer 1412*a*-1. In other words, it is necessary to prevent the laser L from being incident or transmitted into the first insulating layer 1412*a*-1. More specifically, it is necessary to prevent the laser L from being transmitted below the upper surface of the first insulating layer 1412*a*-1.

Accordingly, in the embodiment, a laser reflective layer 1414 capable of reflecting the laser L is provided between the upper layer 1411 and the intermediate layer 1412. That is, a laser reflective layer 1414 for reflecting the laser L is provided between the upper layer 1411 and the first insulating layer 1412*a*-1.

The laser reflective layer 1414 may be provided so that the reflectance of the laser L irradiated for bonding the lead part 1300 and the printed circuit board 1410 is 95% or more. That is, the laser reflective layer 1414 is provided so that the reflectance of the laser L of a wavelength of 1000 nm to 1100 nm is 95% or more.

The laser reflective layer 1414 is made of a material including a metal, and may be made of silver (Ag). In addition, the thickness of the laser reflective layer 1414 may be provided with any thickness as long as the reflectance can be 95, or more. In this case, the thickness of the laser reflective layer 1414 is preferably thinner than that of the upper layer 1411, the lower layer 1413, and the intermediate layer 1412.

Hereinafter, a method of bonding a lead part to a protection circuit module according to an embodiment of the present invention will be described with reference to FIGS. 1 to 3.

First, a protection circuit module 1400 including a printed circuit board 1410 according to the embodiment is prepared. That is, provided is a printed circuit module 1400 including a printed circuit board 1410 provided with a laser reflective layer 1414 having a laser reflectance of 95% or more between the upper layer 1411 and the intermediate layer 1412 as including an upper layer 1411, an intermediate layer 1412, and a lower layer 1413, and a protection circuit element 1420 mounted on the printed circuit board 1410.

Then, as shown in FIGS. 1 to 3, the protection circuit module 1400 is positioned below the lead part 1300 connected to each of the positive and negative electrodes of the battery cell 1200, that is, the positive and negative lead parts 1300*a* and 1300*b*.

Thereafter, the laser L is irradiated from the upper side of the positive and negative lead parts 1300*a* and 1300*b* as shown in FIGS. 2 and 3. At this time, a laser L having a wavelength of 1000 nm to 1100 nm, more specifically, a wavelength of 1060 nm to 1080 nm is irradiated. As a more specific example, a laser L of 1070 nm is irradiated.

Accordingly, the laser L is irradiated to the printed circuit board 1410 of the lead part 1300 and the protection circuit module 1400, and at least a portion of each of the lead part 1300 and the printed circuit board 1410 is melted and bonded to each other by the heat of the laser L. That is, at least a portion of the upper layer 1411 and the lead part 1300 of the printed circuit board 1410 is melted and joined.

In this case, the laser L irradiated toward the lead part 1300 and the printed circuit board 1410 may pass through the lead part 1300 and the upper layer 1411 of the printed circuit board 1410. That is, the laser L may be incident into the lead part 1300 and the upper layer 1411. However, the laser L that has passed through the upper layer 1411 is reflected by the laser reflective layer 1414 thereunder as shown in FIG. 3. Accordingly, the laser L does not pass through the first insulating layer 1412*a*-1 positioned under the laser reflective layer 1414, and thus does not enter the lower side of the first insulating layer 1412*a*-1.

More specifically, 95% or more of the laser L that has passed through the upper layer 1411 is reflected from the laser reflective layer 1414 and goes out to the upper side of the upper layer 1411 again. Accordingly, a very small amount of less than 5% of the laser L that has passed through the upper layer 1411 may be incident on the first insulating layer 1412*a*-1 after passing through the laser reflective layer 1414.

As such, in the embodiment, it is possible to suppress or prevent the laser L irradiated for bonding from being incident to the intermediate layer 1412. That is, it is possible to suppress or prevent incident or transmission into the first insulating layer 1412*a*-1. Accordingly, it is possible to prevent the intermediate layer 1412 provided under the upper layer 1411 from being damaged by the laser L, and for this reason, damage to the printed circuit board 1410 or the protection circuit module 1400 by the laser L can be prevented.

INDUSTRIAL APPLICABILITY

According to an embodiment of the present invention, it is possible to suppress or prevent the laser irradiated for bonding the lead part and the protection circuit module from being incident to the intermediate layer of the protection circuit module. Therefore, it is possible to prevent the intermediate layer of the protection circuit module from being damaged by the laser, thereby preventing damage to the protection circuit module by the laser.

The invention claimed is:

1. A protection circuit module comprising:
 a printed circuit board configured to be connected to a positive lead part and a negative lead part connected to a battery cell,
 wherein the printed circuit board comprises:
 an upper layer bonded to the positive lead part and the negative lead part so as to be electrically connected;
 an intermediate layer including a first insulating layer including a material containing an epoxy resin and provided below the upper layer; and
 a laser reflective layer provided between the upper layer and the first insulating layer and reflecting light from a laser, and
 wherein an end of the upper layer and an end of the laser reflective layer are aligned in a cross sectional view.

2. The protection circuit module of claim 1, wherein the laser reflective layer has a reflectance of 95% or more of the light having a wavelength of 1000 nm to 1100 nm.

3. The protection circuit module of claim 2, wherein the laser reflective layer has a reflectance of 95% or more of the light having a wavelength of 1060 nm to 1080 nm.

4. The protection circuit module of claim 2, wherein the laser reflective layer includes silver (Ag).

5. The protection circuit module of claim 2, wherein the laser reflective layer is thinner than the upper layer and the intermediate layer.

6. The protection circuit module of claim 1, wherein the upper layer includes copper (Cu), and
 wherein the first insulating layer includes a material including the epoxy resin and glass fiber.

7. The protection circuit module of claim 6, wherein the intermediate layer comprises:
 second and third insulating layers provided below the first insulating layer;
 a first metal layer provided between the first insulating layer and the second insulating layer; and
 a second metal layer provided between the second insulating layer and the third insulating layer.

8. The protection circuit module of claim 7, wherein the second and third insulating layers include a material including an epoxy resin and glass fiber, and
 wherein the first and second metal layers include copper (Cu).

9. The protection circuit module of claim 1, wherein an end of the intermediate layer is aligned with both the end of the upper layer and the end of the laser reflective layer in the cross sectional view.

* * * * *